United States Patent
Arik et al.

(10) Patent No.: US 8,960,972 B2
(45) Date of Patent: *Feb. 24, 2015

(54) LIGHTING SYSTEM WITH THERMAL MANAGEMENT SYSTEM

(71) Applicant: General Electric Company, Schenectady, NY (US)

(72) Inventors: Mehmet Arik, Uskudar Istanbul (TR); Stanton Earl Weaver, Northville, NY (US); Thomas Elliot Stecher, Scotia, NY (US); Charles Erklin Seeley, Niskayuna, NY (US); Glenn Howard Kuenzler, Beachwood, OH (US); Charles Franklin Wolfe, Jr., Albany, NY (US); Yogen Vishwas Utturkar, Niskayuna, NY (US); Rajdeep Sharma, Niskayuna, NY (US); Satish Prabhakaran, Niskayuna, NY (US); Tunc Icoz, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 24 days.

This patent is subject to a terminal disclaimer.

(21) Appl. No.: 13/887,793

(22) Filed: May 6, 2013

(65) Prior Publication Data
US 2013/0241415 A1    Sep. 19, 2013

Related U.S. Application Data

(63) Continuation of application No. 12/711,000, filed on Feb. 23, 2010, now Pat. No. 8,434,906.

(51) Int. Cl.
| | | |
|---|---|---|
| *F21V 29/00* | (2006.01) | |
| *H05B 33/08* | (2006.01) | |
| *F21V 29/02* | (2006.01) | |
| *F21K 99/00* | (2010.01) | |
| *F21Y 101/02* | (2006.01) | |
| *F21V 23/00* | (2006.01) | |
| *F21Y 105/00* | (2006.01) | |

(52) U.S. Cl.
CPC ............ H05B 33/0803 (2013.01); F21V 29/02 (2013.01); F21V 29/2206 (2013.01);
(Continued)

(58) Field of Classification Search
USPC .................. 362/294, 249.02, 49, 96; 361/702; 257/712
See application file for complete search history.

(56) References Cited

U.S. PATENT DOCUMENTS

| | | |
|---|---|---|
| 7,284,878 B2 | 10/2007 | Dorogi et al. |
| 7,438,440 B2 | 10/2008 | Dorogi |

(Continued)

FOREIGN PATENT DOCUMENTS

WO    2008032251 A1    3/2008

OTHER PUBLICATIONS

Search Report and Written Opinion from PCT Application No. PCT/US2010/061227 dated Dec. 6, 2011.

*Primary Examiner* — Ali Alavi
(74) *Attorney, Agent, or Firm* — Ziolkowski Patent Solutions Group, SC; Jean K. Testa

(57) ABSTRACT

Lighting systems having unique configurations are provided. For instance, the lighting system may include a light source, a thermal management system and driver electronics, each contained within a housing structure. The light source is configured to provide illumination visible through an opening in the housing structure. The thermal management system is configured to provide an air flow, such as a unidirectional air flow, through the housing structure in order to cool the light source. The driver electronics are configured to provide power to each of the light source and the thermal management system.

21 Claims, 6 Drawing Sheets

(52) U.S. Cl.
CPC ............ *F21V29/405* (2013.01); *F21K 9/1375* (2013.01); *F21Y 2101/02* (2013.01); *F21V 29/225* (2013.01); *F21V 29/2293* (2013.01); *F21V 23/006* (2013.01); *F21Y 2105/001* (2013.01); *H01L 2924/0002* (2013.01)
USPC .......................................... 362/373; 362/294

(56) References Cited

U.S. PATENT DOCUMENTS

| | | |
|---|---|---|
| 7,518,148 B2 | 4/2009 | Liu et al. |
| 7,543,961 B2 | 6/2009 | Arik et al. |
| 7,556,406 B2 | 7/2009 | Petroski et al. |
| 8,434,906 B2 * | 5/2013 | Arik et al. ................. 362/294 |
| 2007/0119573 A1 | 5/2007 | Mahalingam et al. |
| 2008/0151541 A1 | 6/2008 | Heffington et al. |
| 2008/0219007 A1 | 9/2008 | Heffington et al. |
| 2009/0084866 A1 | 4/2009 | Grimm et al. |
| 2009/0109625 A1 * | 4/2009 | Booth et al. ................. 361/702 |
| 2009/0284155 A1 | 11/2009 | Reed et al. |
| 2010/0033071 A1 * | 2/2010 | Heffington et al. ............ 313/46 |
| 2010/0039012 A1 | 2/2010 | Grimm |
| 2011/0095690 A1 * | 4/2011 | Sagal ........................ 315/113 |
| 2011/0162823 A1 | 7/2011 | Sharma et al. |
| 2012/0098425 A1 | 4/2012 | Arik et al. |

* cited by examiner

LIGHTING SYSTEM WITH THERMAL MANAGEMENT SYSTEM

CROSS REFERENCE TO RELATED APPLICATION

The present invention is a continuation of and claims priority to U.S. patent application Ser. No. 12/711,000 filed Feb. 23, 2010, the disclosure of which is incorporated herein by reference.

STATEMENT REGARDING FEDERALLY SPONSORED RESEARCH & DEVELOPMENT

This invention was made with Government support under contract number DE-FC26-08NT01579 awarded by The United States Department of Energy. The Government has certain rights in the invention.

BACKGROUND OF THE INVENTION

The invention relates generally to lighting systems, and more particularly to lighting systems having thermal systems.

High efficiency lighting systems are continually being developed to compete with traditional area lighting sources, such as incandescent or florescent lighting. While light emitting diodes (LEDs) have traditionally been implemented in signage applications, advances in LED technology have fueled interest in using such technology in general area lighting applications. LEDs and organic LEDs are solid-state semiconductor devices that convert electrical energy into light. While LEDs implement inorganic semiconductor layers to convert electrical energy into light, organic LEDs (OLEDs) implement organic semiconductor layers to convert electrical energy into light. Significant developments have been made in providing general area lighting implementing LEDs and OLEDs.

One potential drawback in LED applications is that during usage, a significant portion of the electricity in the LEDs is converted into heat, rather than light. If the heat is not effectively removed from an LED lighting system, the LEDs will run at high temperatures, thereby lowering the efficiency and reducing the reliability of the LED lighting system. In order to utilize LEDs in general area lighting applications where a desired brightness is required, thermal management systems to actively cool the LEDs may be considered. Providing an LED-based general area lighting system that is compact, lightweight, efficient, and bright enough for general area lighting applications is challenging. While introducing a thermal management system to control the heat generated by the LEDs may be beneficial, the thermal management system itself also introduces a number of additional design challenges.

BRIEF DESCRIPTION OF THE INVENTION

In one embodiment, a lighting system is provided. The lighting system includes a housing structure. The lighting system further includes a light source configured to provide illumination visible through an opening in the housing structure. Still further, the lighting system includes a thermal management system configured to provide a unidirectional air flow through the housing structure. Additionally, the lighting system includes driver electronics configured to provide power to each of the light source and the thermal management system.

In another embodiment, a lighting system is provided that includes an array of light emitting diodes (LEDs) arranged on a surface of a lighting plate. The lighting system further includes a thermal management system arranged above the array of LEDs, wherein the thermal management system comprises a plurality of synthetic jet devices, wherein each of the plurality of synthetic jet devices is configured to produce a jet stream in a direction parallel to the surface of the lighting plate.

In another embodiment, a method of cooling a lighting system is provided. The method includes illuminating a plurality of lighting elements arranged on a planar surface of the lighting system, transferring heat from the plurality of lighting elements to a heat sink, and driving air from an area outside of the lighting system through the lighting system and back out to the area outside of the lighting system.

In another embodiment, a lighting system is provided, wherein the lighting system includes an Edison base configured to couple to electrically couple to a standard light socket, a light source and a thermal management system. The thermal management system includes passive cooling components and active cooling components.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Embodiments of the invention generally relate to LED-based area lighting systems. A novel luminaire is provided with driver electronics, LED light source and an active cooling system, which includes synthetic jets. In one embodiment, the lighting system fits into a standard 6" (15.2 cm) halo and leaves approximately 0.5" (1.3 cm) between the lamp and halo. Alternatively, the lighting system may be scaled differently, depending on the application. The presently described embodiments provide a lighting source, which produces approximately 1500 lumens (lm) with a driver electronics efficiency of 90%, and may be useful in area lighting applications. The thermal management system includes synthetic jet cooling which provides an air flow in and out of the lighting system, allowing LED junction temperatures to remain less than 100° C. for the disclosed embodiments. To reach 1500 lm, the disclosed light source utilizes blue LEDs and a phosphor mixture that results in a correlated color temperature (CCT) of approximately 3000° Kelvin and a color rendering index (CRI) of over 82. For example, in one embodiment, the light source may utilize 19 LEDs.

Advantageously, in one embodiment, the lighting system uses a conventional screw-in base (i.e., Edison base) that is connected to the electrical grid. The electrical power is appropriately supplied to the thermal management system and to the light source by the same driver electronics unit. In one embodiment, the LEDs of the light source are driven at 500 mA and 59.5 V while the synthetic jets of the thermal management system are driven with less than 200 Hz and 64 V (peak-to-peak). The LEDs provide a total of over 1500 steady state face lumens, which is sufficient for general area lighting applications. In the illustrated embodiments described below, five synthetic jet devices are provided to work in conjunction with a heat sink having a plurality of fins, and air ports, to both actively and passively cool the LEDs. As will be described, the synthetic jet devices are excited with a desired power level to provide adequate cooling during illumination of the LEDs.

Accordingly, embodiments of the invention provide a unique compact lighting system capable of efficiently providing a desired level of light for area lighting applications, utilizing a reduced number of LEDs, compared to conventional systems. The disclosed thermal management system provides air flow from outside of the housing structure, through the lighting system, and back into the ambient air. In one embodiment, the air flow is unidirectional, as will be described further below. By using the active cooling technology of synthetic jets, in combination with the passive heat sink and air ports described below, embodiments of the invention provide an inexpensive lighting system capable of producing 1500 lumens, with a reduced number of LEDs.

Figure 1:
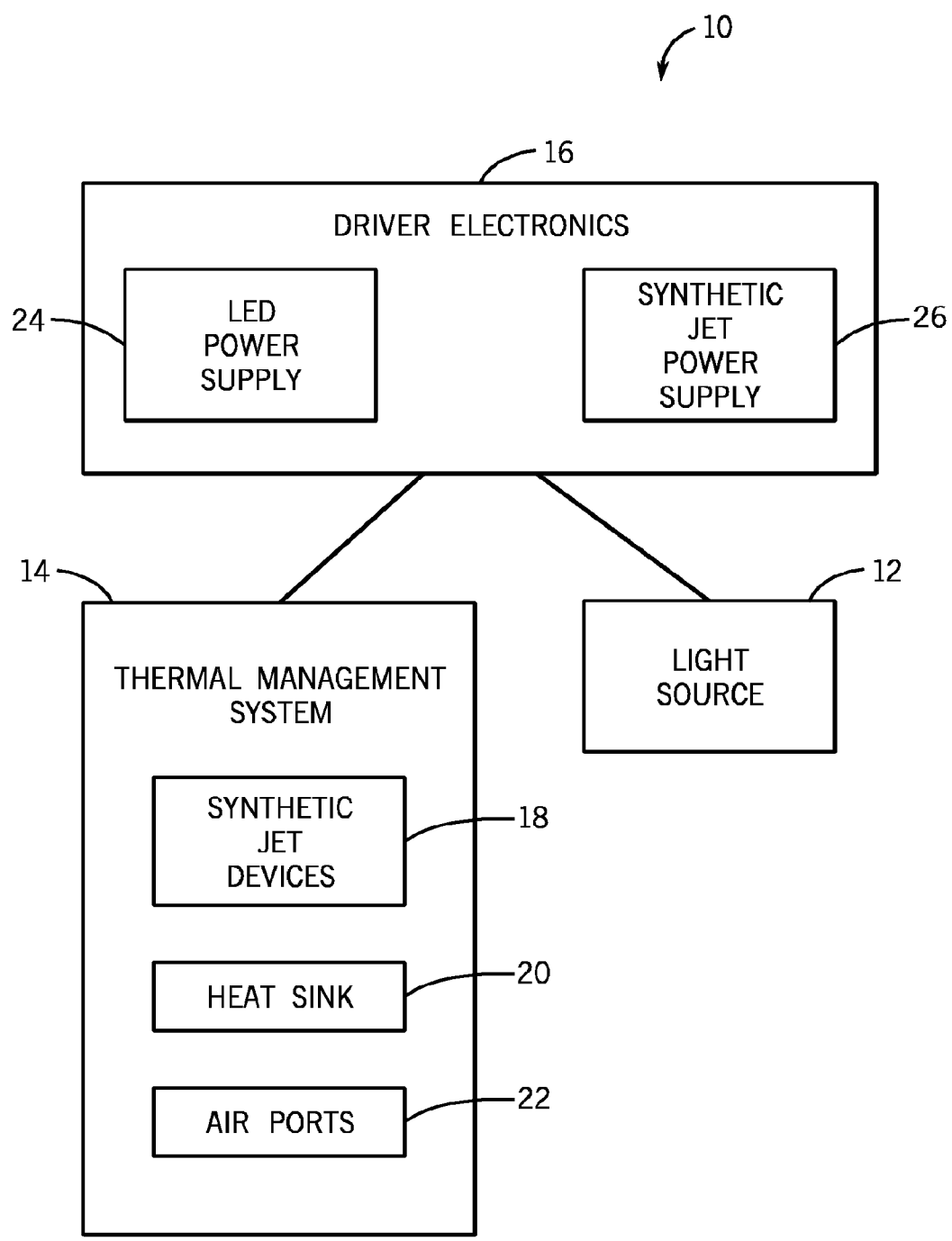
FIG. 1 is block diagram of a lighting system in accordance with an embodiment of the invention.

Referring now to FIG. 1, a block diagram illustrating a lighting system 10 in accordance with embodiments of the present invention is illustrated. In one embodiment, the lighting system 10 may be a high-efficiency solid-state down-light luminaire. In general, the lighting system 10 includes a light source 12, a thermal management system 14, and driver electronics 16 configured to drive each of the light source 12 and the thermal management system 14. As discussed further below, the light source 12 includes a number of LEDs arranged to provide down-light illumination suitable for general area lighting. In one embodiment, the light source 12 may be capable of producing at least approximately 1500 face lumens at 75 lm/W, CRI>80, CCT=2700 k-3200 k, 50,000 hour lifetime at a 100° C. LED junction temperature. Further, the light source 12 may include color sensing and feedback, as well as being angle control.

As will also be described further below, the thermal management system 14 is configured to cool the LEDs such that the LED junction temperatures remain at less than 100° C. under normal operating conditions. In one embodiment, the thermal management system 14 includes synthetic jet devices 18, heat sinks 20 and air ports 22 which are configured to work in conjunction to provide the desired cooling and air exchange for the lighting system 10.

The driver electronics 16 includes an LED power supply 24 and a synthetic jet power supply 26. As will be described further below, in accordance with one embodiment, the LED power supply 24 and the synthetic jet power supply 26 each comprise a number of chips and integrated circuits residing on the same system board, such as a printed circuit board (PCB), wherein the system board for the driver electronics 16 is configured to drive the light source 12, as well as the thermal management system 14.

Figure 2:
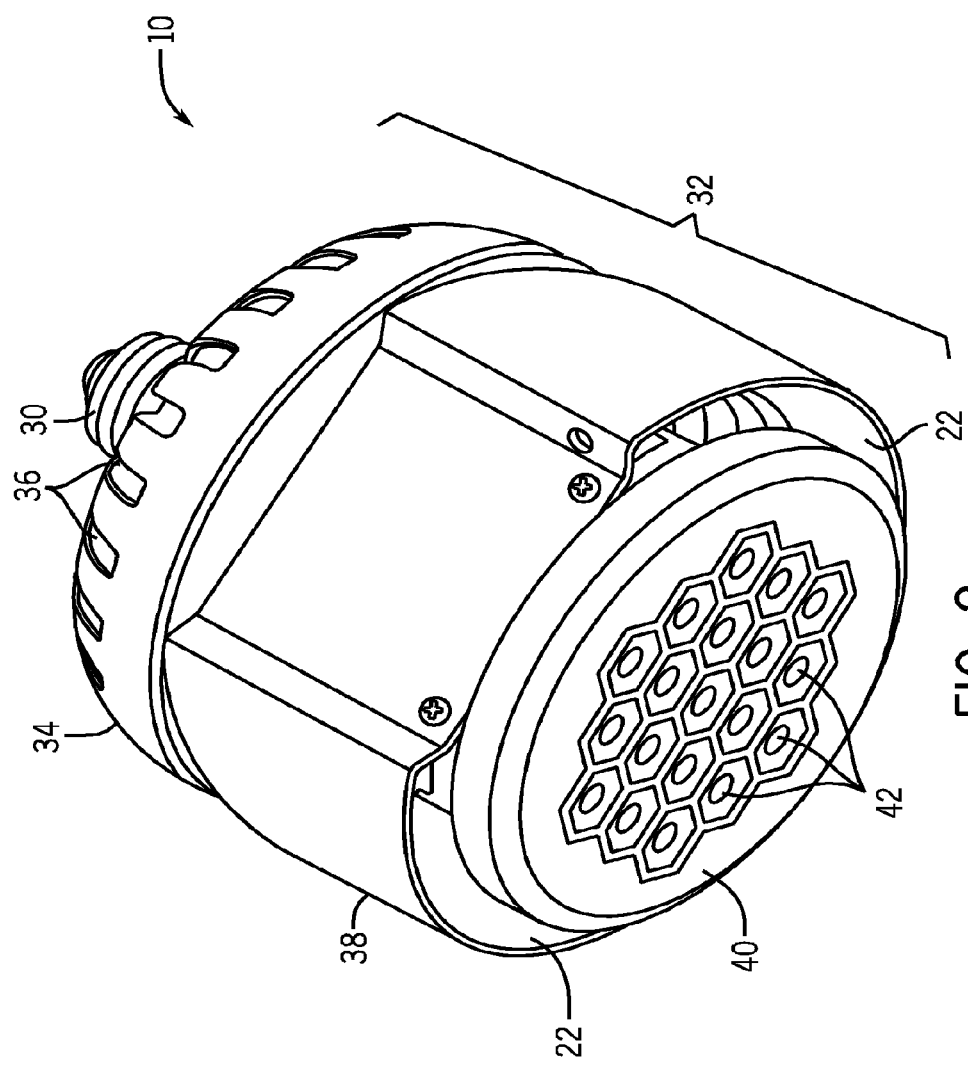
FIG. 2 illustrates a perspective view of a lighting system, in accordance with an embodiment of the invention.

Referring now to FIG. 2, a perspective view of one embodiment of the lighting system 10 is illustrated. In one embodiment, the lighting system 10 includes a conventional screw-in base (Edison base) 30 that may be connected to a conventional socket that is coupled to the electrical power grid. The system components are contained within a housing structure generally referred to as a housing structure 32. As will be described and illustrated further with regard to FIG. 3, the housing structure 32 is configured to support and protect the internal portion of the light source 12, the thermal management system 14, and the driver electronics 16.

In one embodiment, the housing structure 32 includes a cage 34, having air slots 36 there through. The cage 34 is configured to protect the electronics board having the driver electronics 16 disposed thereon. The housing structure 32 further includes a thermal management system housing 38 to protect the components of the thermal management system 14. In accordance with one embodiment, the thermal management system housing 38 is shaped such that air ports 22 allow ambient air to flow in and out of the lighting system 10 by virtue of synthetic jets in the thermal management system 14, as described further below. Further, the housing structure 32 includes a faceplate 40 configured to support and protect the light source 12. As will be described and illustrated in FIG. 3, the faceplate 40 includes an opening which is sized and shaped to allow the faces of the LEDs 42 and/or optics, of the light source 12, to be exposed at the underside of the lighting system 10 such that when illuminated, the LEDs 42 provide general area down-lighting.

Figure 3:
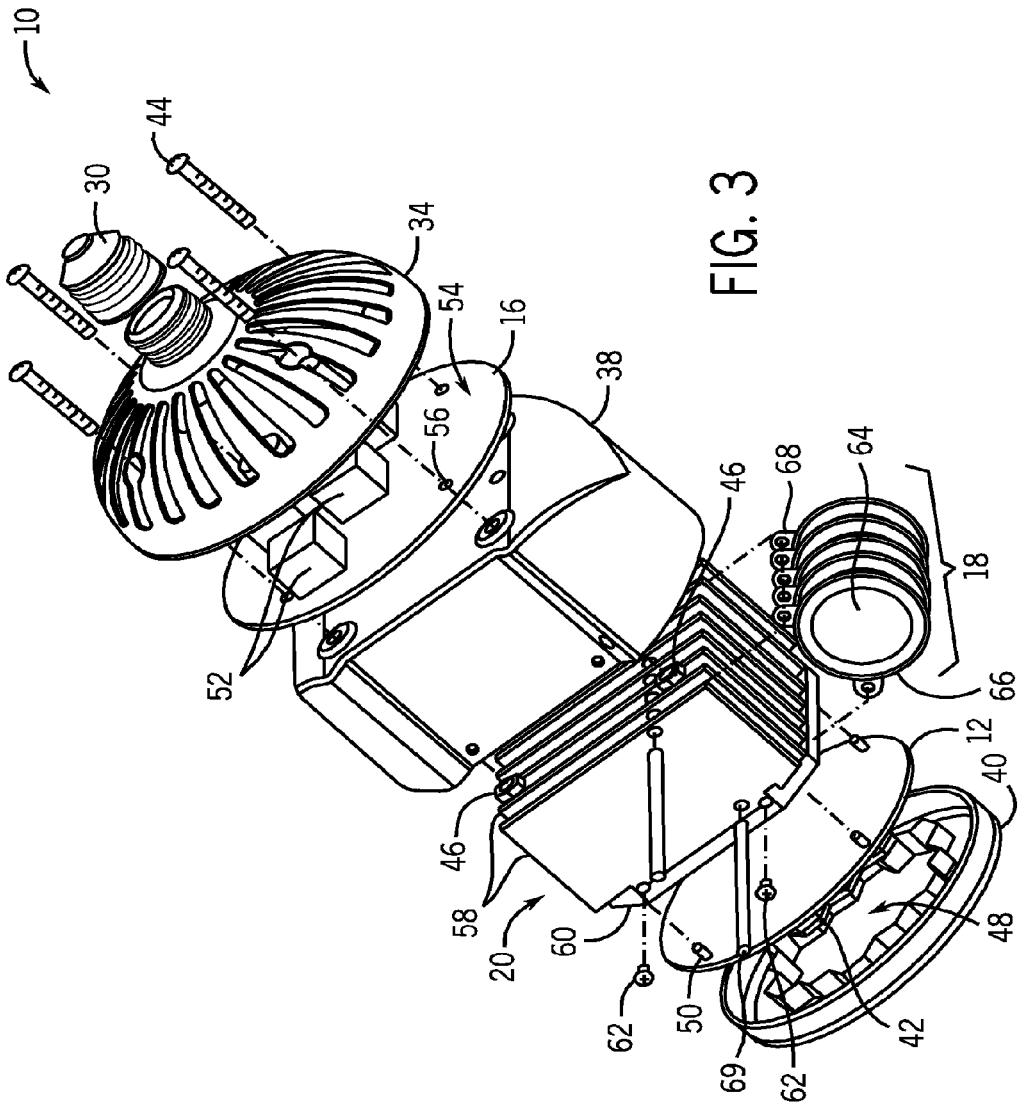
FIG. 3 illustrates an exploded view of the lighting system of FIG. 2, in accordance with an embodiment of the invention.

Turning now to FIG. 3, an exploded view of the lighting system 10 is illustrated. As previously described and illustrated, the lighting system 10 includes a housing structure 32 which includes the cage 34, the thermal management system housing 38, and the faceplate 40. When assembled, the housing structure 32 is secured by screws 44 configured to engage the cage 34, the thermal management system housing 38, and a holding mechanism such as a plurality of nuts 46. In one embodiment, the faceplate 40 is sized and shaped to frictionally engage a base of the lighting system 10, and/or secured by another fastening mechanism such as additional screws (not shown). An opening 48 in the faceplate 40 is sized and shaped such that the LEDs 42 positioned on the underside of the light source 12 may be visible to the opening 48. The light source 12 may also include fastening components, such as pins 50 configured engage an underside of the thermal management system 14. As will be appreciated, any variety of fastening mechanisms may be included to secure the components of the lighting system 10, within the housing structure 32, such that the lighting system 10 is a single unit, once assembled for use.

As previously described, the driver electronics 16 which are housed within the cage 34 include a number of integrated circuit components 52 mounted on a single board, such as a printed circuit board (PCB) 54. As will be appreciated, the PCB 54 having components mounted thereto, such as the integrated circuit components 52, forms a printed circuit assembly (PCA). Conveniently, the PCB 54 is sized and shaped to fit within the protective cage 34. Further, the PCB 54 includes through-holes 56 configured to receive the screws 44 such that the driver electronics 16, the thermal management system housing 38, and the cage 34 are mechanically coupled together. In accordance with the presently described embodiment, all of the electronics configured to provide power for the light source 12, as well as the thermal management system 14 are contained on a single PCB 54, which is positioned above the thermal management system 14 and light source 12. Thus, in accordance with the present design, the light source 12 and the thermal management system 14 share the same input power.

In the illustrated embodiment, the thermal management system 14 includes a heat sink 20 having a number of fins 58 coupled to a base 60 via screws 62. As will be appreciated, the heat sink 20 provides a heat-conducting path for the heat produced by the LEDs 42 to be dissipated. The base 60 of the heat sink 20 is arranged to rest against the backside of the light source 12, such that heat from the LEDs 42 may be transferred to the base 60 of the heat sink 20. The fins 58 extend perpendicularly from the base 60, and are arranged to run parallel to one another.

The thermal management system 14 further includes a number of synthetic jet devices 18 which may be mounted on the fins 58 of the heat sink 20. As will be appreciated, each synthetic jet device 18 is configured to provide a synthetic jet flow to provide further cooling of the LEDs 48. Each synthetic jet device 18 includes a diaphragm 64 which is configured to be driven by the synthetic jet power supply 26 such that the diaphragm 64 moves rapidly back and forth within a hollow frame 66 to create an air jet through an opening in the frame 66 which will be directed through the gaps between the fins 58 of the heat sink 20. The synthetic jet devices 18 may include tabs 68, having holes therethrough, such that pins 69 may be used to secure each synthetic jet device 18 to a respective fin 58. The thermal management system 14 and the unidirectional airflow created by these synthetic jet devices 18 will be described further below with respect to FIG. 4.

Figure 4:
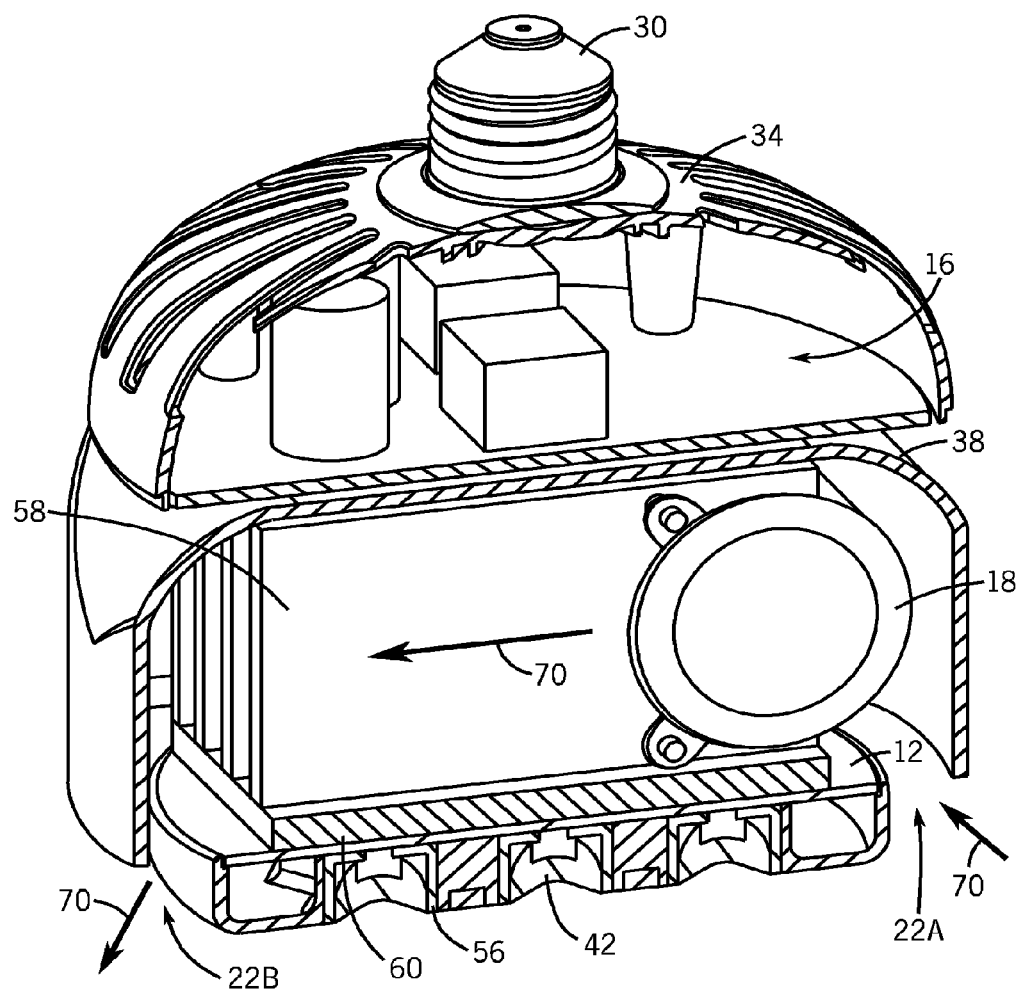
FIG. 4 illustrates the airflow of a thermal management system of the lighting system of the FIGS. 2 and 3, in accordance with an embodiment of the invention.

Referring now to FIG. 4, a partial cross-sectional view of the lighting system 10 is provided to illustrate certain details of the thermal management system 14. As previously discussed, the thermal management system 14 includes synthetic jet devices 18, heat sink 20, and air ports 22. The base 60 of the heat sink 20 is arranged in contact with the underlying light source 12, such that heat can be passively transferred from the LEDs 42 to the heat sink 20. The array of synthetic jet devices 18 is arranged to actively assist in the linear transfer of heat transfer, along the fins 58 of the heat sink 20. In the illustrated embodiment, one synthetic jet device 18 is positioned within the recesses provided by the gaps between the parallel fins 58. The synthetic jet devices 18 can be powered to create a unidirectional flow of air inside the heat sink 20, between the fins 58, such that air from the surrounding area is entrained into the duct through one of the ports 22A and warm air from the heat sink 20 is ejected into the ambient air through the other port 22B. The unidirectional airflow into the port 22A through the fin gaps and out the port 22B is generally indicated by airflow arrows 70. Advantageously, the unidirectional air flow 70 prevents heat buildup within the lighting system 10, which is a leading cause for concern in the design of thermal management of down-light systems. In alternative embodiments, the air flow created by the synthetic jet devices 18 may be radial or impinging, for instance. The presently described thermal management system 14 is capable of providing an LED junction temperature of less than 100° C. at approximately 30 W of heat generation.

As will be appreciated, synthetic jets, such as the synthetic jet devices 18, are zero-net-massflow devices that include a cavity or volume of air enclosed by a flexible structure and a small orifice through which air can pass. The structure is induced to deform in a periodic manner causing a corresponding suction and expulsion of the air through the orifice. The synthetic jet 18 imparts a net positive momentum to its external fluid, here ambient air. During each cycle, this momentum is manifested as a self-convecting vortex dipole that emanates away from the jet orifice. The vortex dipole then impinges on the surface to be cooled, here the underlying light source 12, disturbing the boundary layer and convecting the heat away from its source. Over steady state conditions, this impingement mechanism develops circulation patterns near the heated component and facilitates mixing between the hot air and ambient fluid.

In accordance with one embodiment, each synthetic jet devices 18 has two piezoelectric disks, excited out of phase and separated by a thin compliant wall with an orifice. This particular design has demonstrated substantial cooling enhancement, during testing of the disclosed design. It is important to note that the synthetic jet operating conditions should be chosen to be practical within lighting applications. The piezoelectric components are similar to piezoelectric buzzer elements. The package that holds the synthetic jet 18 in the luminaire should orient it for maximum cooling effectiveness without mechanically constraining the motion of the synthetic jet. The cooling performance and operating characteristics of the synthetic jet device 18 are due to the interaction between several physical domains including electromechanical coupling in the piezoelectric material used for actuation, structural dynamics for the mechanical response of the flexible disks to the piezoelectric actuation, and fluid dynamics and heat transfer for the jet of air flow 70. Sophisticated finite element (FE) and computational fluid dynamics (CFD) software programs are often used to simulate the coupled physics for synthetic jet design and optimization.

Figure 5:
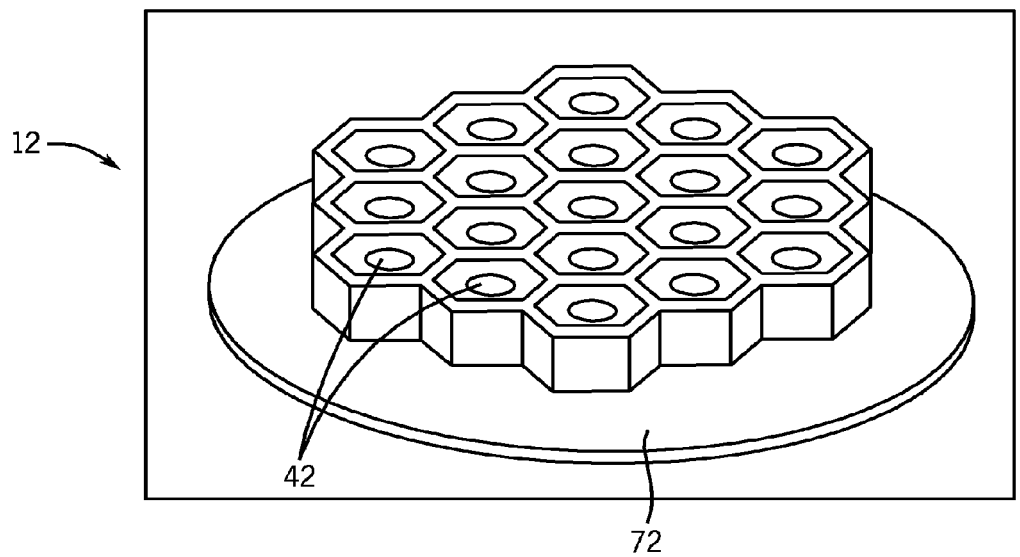
FIG. 5 illustrates a perspective view of the light source of the lighting system of FIGS. 2 and 3, in accordance with an embodiment of the invention.

Referring now to FIG. 5, a light source 12 in accordance with one embodiment of the invention is illustrated. As illustrated, the light source 12 includes a number of LEDs 42 arranged on a plate 72. In accordance with one embodiment, the light source 12 may include nineteen (19) blue LEDs 42. For example, each blue LED may be a CREE EZ 1000, 470 nm chip. Each LED 42 utilizes YAG phosphor for warm light conversion. Each LED 42 may also include an intermediate silicone molded lambertain lens. The presently described layout was tested and resulted in 1500 lm with a 25° full width half max optics being possible at 55 LPW, 3000 K and CRI of 82 with the nineteen blue LEDs 42. As will be appreciated, the light source 12 is in thermal communication with the heat sink 20 by a highly thermally-conductive interface.

Figure 6:
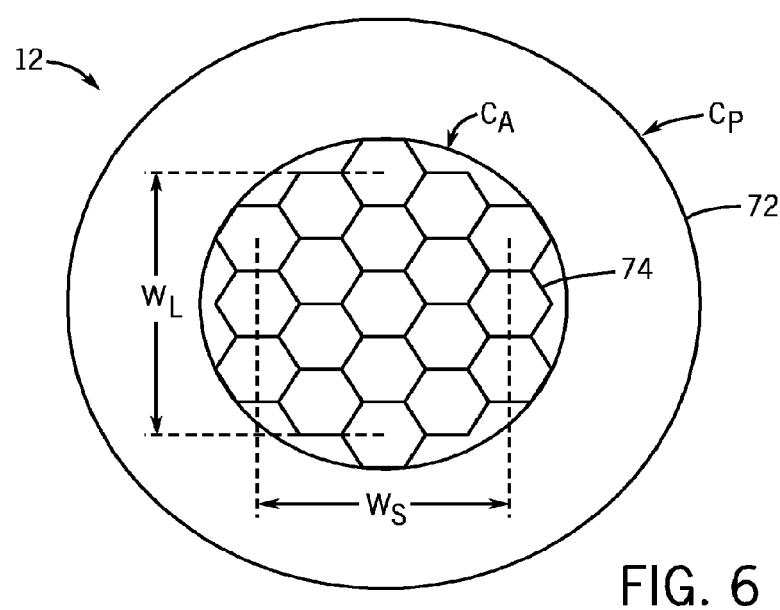
FIG. 6 illustrates a layout design of the light source of FIG. 5, in accordance with an embodiment of the invention.

As will be appreciated, various types of LEDs 42 may be employed. Further, with increased drive capabilities, the number of LEDs 42 in the light source 12 may be reduced. In general, utilizing LEDs 42 that are provided as bare die provides a small light source 12, reduced optical size, and easy interchangeability of the individual LEDs 42. FIG. 6 illustrates one design layout of the light source 12, as utilized in the embodiment of FIG. 5. As illustrated, each individual LED 42 may be positioned onto a hexagonal footprint 74 and arranged in a honeycomb pattern to minimize the overall footprint of the LED array. In accordance with one embodiment, the circumference of the array ($C_A$) is approximately equal to 75 mm. The circumference of the plate 72 ($C_P$) may be approximately 130 mm. Further, the long width ($W_L$) and the short width ($W_S$) may be equal to approximately 57 mm and 49.5 mm, respectively. As will be appreciated, various sizes and dimensions of the LEDs 42 and overall light source 12 may be employed.

As previously described, the driver electronics 16 include an LED power supply 24 and a synthetic jet power supply 26. In one embodiment, the electronics for each component of the driver electronics 16 are provided on a single printed circuit board 54 (FIG. 3). Any number of designs for the driver electronics 16 may be employed to achieve a desired result of a high efficiency lighting system 10 capable of providing at least approximately 1500 lm using the LEDs 42. As described further below, FIG. 7 illustrates one embodiment of the LED power supply 24 and FIG. 8 illustrates one embodiment of the synthetic jet power supply 26, which have been tested for use in the embodiments of the invention, and which have proven acceptable for driving the light source 12 and thermal management system 14.

Figure 7:
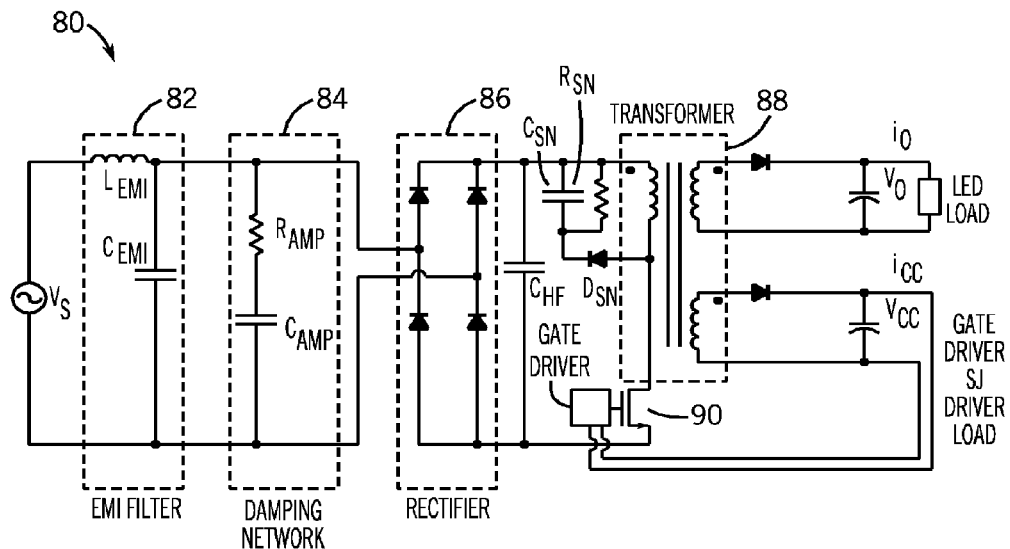
FIG. 7 illustrates a schematic diagram of a circuit configured to provide power to the lighting source of FIG. 5, in accordance with an embodiment of the invention.
Figure 8:
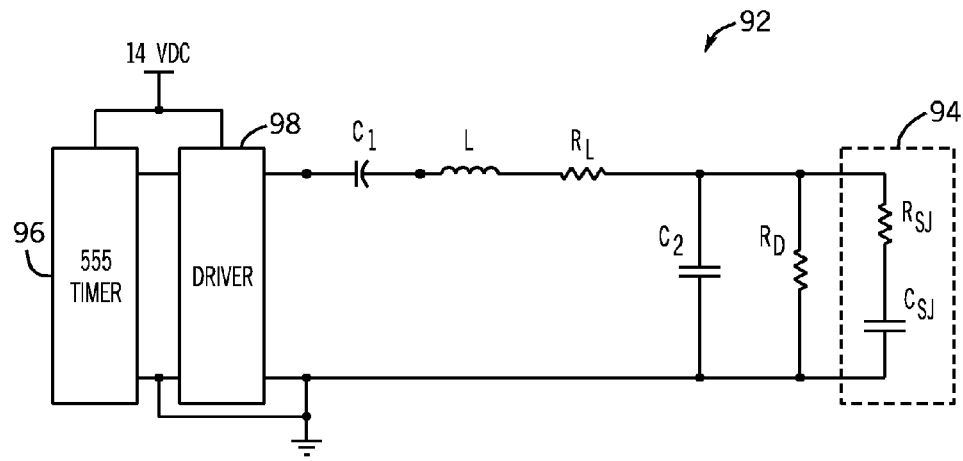
FIG. 8 illustrates a schematic diagram of a circuit configured to provide power to the thermal management system, in accordance with an embodiment of the invention.

Specifically, the illustrated schematic diagram of FIG. 7 is capable of driving the light source 12 such that the lighting system 10 has an efficiency of greater than 90%, a power factor greater than or equal to 0.9, galvanic isolation between input AC voltage and output voltage, and an input voltage of 120 V RMS at 60 Hz. As is well known, the illustrated LED power supply 24 includes a fly back converter topology. The fly back topology provides isolation and also adjustment of voltage conversion ratios through the turns ratios of the constituent transformer. The switching frequency of the LED power supply circuit 24 can be chosen in the low 100 kHz in order to affect reduction in size of the passive components. The circuit of FIG. 8 proved acceptable in providing sufficient drive conditions for the synthetic jets 18 of the thermal management system 14 described above. Those skilled in the art will appreciate that any number of circuits may be employed in the lighting system 10, in order to meet the preferred system requirements for driving each of the light source 12 and thermal management system 14.

Test Data and Example Circuit Designs

In choosing an acceptable circuit design for the LED power supply 24, designs meeting the following parameters were considered.

Efficiency of ≥90%.
Power Factor ≥0.9 for commercial applications, ≥0.7 for Residential applications.
Input voltage of 120 V RMS at 60 Hz.
Galvanic isolation between input AC voltage and output voltages.
Cost of supply to be approximately $10.

Based on the desired parameters, the flyback converter topology illustrated in FIG. 7 was chosen for the LED power supply 24. The flyback converter circuit 80 is a well understood topology used in lighting applications. The reliability of this circuit is well understood and sourcing components for this circuit in mass production is expected to be cost effective. The flyback topology provides isolation and also allows adjustment of voltage conversion ratio through the turns ratio of the constituent transformer. The switching frequency of the circuit can be chosen in the low 100s of kHz in order to effect reduction in size of the passive components.

The basic circuit 80 of a flyback converter is shown in FIG. 7. The circuit 80 includes an electromagnetic interference (EMI) filter 82, a damping network 84, a rectifier 86 to rectify the AC input voltage, and a transformer 88. The flyback transformer 88 converts an input voltage (with peak value $V_i$) to DC voltages $V_o$ for the LEDs 42 and $V_{cc}$ for auxiliary electronics that power house-keeping circuits (not shown) and also the power electronics 26 for the synthetic jets 18. A switch $Q_1$ (here, the MOSFET 90, described further below) operates at the switching frequency of interest $f_{sw}$. The transfer function of the flyback converter 80 is:

$$\frac{V_o}{V_i} = \frac{N_s}{N_p} \frac{D}{1-D} \tag{1}$$

where $N_p$ and $N_s$ represent the primary and secondary turns of the flyback transformer 88 and D is the duty cycle of operating the switch $Q_1$. One important consideration in the design of this converter 80 was the ability to maintain a high power factor during operation. A flyback converter operated in a discontinuous mode of operation achieves a natural power factor of 1. For example, a simple case of the flyback converter 80 operated with duty cycle $D_1$ and time period T may be illustrative. If the flyback converter 80 is operated in the discontinuous mode of operation, the current in the magnetizing inductance L will ramp linearly up to a peak value $i_{pk}$ during the time the switch $Q_1$ is on and then ramp linearly down to zero when the switch $Q_1$ is off. If the inductor is sized appropriately, the inductor current will reach zero before the start of the next cycle. At the end of the period $D_1T$ the energy stored in the inductor can be represented as follows:

$$E = \frac{1}{2} L i_{pk}^2 \tag{2}$$

The value $i_{pk}$ can be represented as $$i_{pk} = V_i \frac{D_1 T}{L} \tag{3}$$

By substituting Equation (3) into Equation (2)

$$E = \frac{1}{2} L \frac{V_i^2 D_1^2 T^2}{L^2} \tag{4}$$
$$= \frac{V_i^2 D_1^2}{2L f_{sw}^2}$$
$$= \frac{V_i^2}{\frac{2L f_{sw}^2}{D_1^2}}$$

The amount of power delivered to the load can thereby deduced as:

$$P_{load} = E \times f_{sw} \tag{5}$$
$$= \frac{V_i^2 D_1^2}{2L f_{sw}^2}$$
$$= \frac{V_i^2}{\frac{2L F_{sw}}{D_1^2}}$$
$$= \frac{V_i^2}{R_{hyp}}$$

For a power supply with an alternating input voltage of RMS value, $V_{in\text{-}rms}$, the input power required by the power supply is $$P_{in} = \frac{V_{in\text{-}rms}^2 D_1^2}{2L f_{sw}^2} \tag{6}$$

Equation (6) was used to calculate the value of magnetizing inductance, L, for the flyback transformer 88. In order to do so, two design parameters—$D_1$ and $f_{sw}$ were fixed. $D_1$ was set to a value of 0.5. The value of $f_{sw}$ was chosen for low conducted emissions. Several standards such as CISPR, IEC, FCC etc. are typically used to limit the maximum conducted emissions. Most of these applications impose constraints on conducted electromagnetic interference (EMI) between 150 kHz and 30 MHz. In order to achieve high impedance to conducted emissions a switching frequency as close 150 kHz was chosen.

For example, at 140 kHz, a symmetric triangular switching ripple current would be expected to conduct currents at the odd harmonics of $f_{sw}$. The first odd harmonic was expected to be 420 kHz. At this frequency, the impedance of the magnetizing inductance, L, was expected to be sufficiently high to limit conducted harmonic currents. An efficiency (η) of 90% was assumed—the specified target efficiency. Based on these parameters, the value of L was calculated as follows:

$$L = \frac{V_{in-rms}^2 D_1^2}{2Lf_{sw}} \frac{\eta}{P_o} \quad (7)$$

$$= \frac{120^2 \times 0.5^2}{2 \times 140 \times 10^3} \frac{90\%}{32.41}$$

$$= 360 \ \mu H$$

TABLE 1

| DESIGN PARAMETERS FOR FLYBACK POWER SUPPLY | |
|---|---|
| Switching frequency (fsw) | 140 kHz |
| Duty cycle for Q | 0.5 |
| RMS input voltage (Vin-rms) | 120 V |
| DC output voltage for LED power stage (Vo) | ≈58 V |
| Required output power (Po) | 32.41 |
| Target efficiency (η) | 90% |
| Magnetizing inductance required (L) | 360 uH |
| Turns ratio ($N_p$:$N_a$) | ≥2.9 |
| Operating temperature of conductor | 100 C. |

The turns ratio of the transformer 88 was calculated based upon the requirement for discontinuous mode of operation. From FIG. 7, the design criterion for discontinuous conduction mode is $$D_1 T > D_2 T \quad (8)$$

The method of volt-second balance across the magnetizing inductance will necessitate $$\frac{N_p}{N_s} > \frac{V_{in-rms} \times \sqrt{(2)}}{V_o} > \frac{120 \times \sqrt{(2)}}{58} > 2.9 \quad (9)$$

The turns ratio was designed to satisfy Equation (9). The design of the core and windings for the flyback transformer was then completed. The skin depth of copper at 100 C is 216 μm. In high frequency designs, proximity and eddy current losses can be significant and can degrade efficiency. Hence, litz wire was chosen in order to reduce the effect of winding losses. Based on analyses presented, litz-wire with AWG 44 (51 μm diameter strands) strands was determined to be a feasible design. Typically, a strand diameter of 3× to 4× smaller than the skin-depth of copper helps maintain the resistance at high-frequency close to the DC resistance. The primary and secondary bundle configurations were chosen based on RMS currents extracted from circuit simulation in LTSPICE [3], as well as commercial availability.

The high-voltage (HV) winding and low-voltage (LV) winding both sustain a low-frequency unipolar current at 60 Hz, and superimposed triangular current at 140 kHz. The choice of strand dimensions was also guided by the amount of area available for the windings. The maximum allowed dimension for the flyback transformer 88 was specified as 2.54 cm for this application. An E-core geometry, E25/10/6, was chosen as the largest core that would fit within constraints. The packing factor $F_p$ for litz winding with circular strands was estimated as follows:

$$F_p = \frac{A_{circle}}{A_{square}} \times 0.5 \quad (10)$$

$$= \frac{\frac{a^2 \pi}{4}}{a^2} \times 0.3$$

$$= 0.23$$

where $A_{circle}$ represents the area occupied by circular strands of diameter a in a square section of side a. The factor of 0.5 was imposed to include the effect of insulation and bend radii of the litz bundle. The chosen strand diameter of 51 μm was implemented along with the area winding window as follows:

$$A_T = \frac{A_w}{2} \times F_p \times \frac{1}{N} \quad (11)$$

where $A_w$ is the available winding area in the bobbin and $A_T$ is the area available for a single turn of a winding with $N_{HV}$ turns. The factor of 2 applies to setting equal areas for the HV and LV windings in a 2-winding design in this application. With a fixed strand diameter ($d_s$), the number of strands required to fit in the winding window can be calculated as follows:

$$N_s = \frac{A_T}{\frac{\pi}{4} d_s^2} \quad (12)$$

$$= \frac{A_w}{2} \times F_p \times \frac{1}{N_{HV}} \times \frac{4}{\pi d_s^2}$$

The number of HV turns required was calculated. For a flyback transformer operating in discontinuous conduction mode, the following equation applies:

$$\int_0^{D_1 T} V_{in}(t) = N_{HV} \times A_{core} \times B_{sat} \quad (13)$$

where $V_{in}(t)$ represents the time varying unipolar input voltage that imposes a unipolar magnetic flux in the magnetic core with cross-sectional area $A_{core}$. The saturation flux density of the material is represented as $B_{sat}$. At the peak of the input voltage, Equation (13) can be computed as:

$$0.5 \times V_{in-rms} \times \sqrt{2} \times T = \frac{0.5 \times V_{in-rms} \times \sqrt{2}}{f_{sw} \times N_{HV} \times A_{core} \times B_{sat}} \quad (14)$$

The core material was chosen as 3C90 Ferrite based on datasheet recommendations for 140 kHz operation and also based on commercial availability at the time of design. The properties of the core are shown in Table II, below:

TABLE II

PARAMETERS FOR E25/10/6, 3C90 CORE

| | |
|---|---|
| Switching frequency (fsw) | 140 kHz |
| Assumed Operating temperature of core | 100 C. |
| Saturation flu density ($B_{sat}$) | 0.38 T |
| Core x-sectional area ($A_{core}$) | $39.5 \times 10^{-6}$ m$^2$ |
| Core volume | $1930 \times 10^{-9}$ m$^3$ |

The number of HV turns was calculated from Equation (14) using parameters in Table II as follows:

$$N_{HV} = \frac{0.5 \times V_{in-rms} \times \sqrt{2}}{f_{sw} \times A_{core} \times B_{sat}} \quad (15)$$

$$= 41$$

The maximum allowed strands for the HV winding was calculated using Equation 12 and as follows:

$$N_{s-HV} \leq \frac{A_w \times F_p}{2} \frac{f_{sw} \times A_{core} \times B_{sat}}{0.5 \times V_{in-rms} \times \sqrt{2}} \times \frac{4}{\pi d_s^2} \leq 78 \quad (16)$$

The number of turns $N_{LV}$ for the LV winding was chosen to be 15 in order to satisfy the equality in Equation (11). The maximum allowed strands for the LV winding was calculated using Equation (12):

$$N_s \leq \frac{A_w}{2} \times F_p \times \frac{1}{N_{LV}} \times \frac{4}{\pi d_s^2} \leq 214 \quad (17)$$

Litz wire with 66 strands of AWG 44 and 150 strands of AWG 44 were chosen for the HV and LV windings respectively. These were the best-fit designs that were commercially available commercially available at the time of design. This completes the design of the high frequency transformer 88.

As will be appreciated, the leakage inductance of the transformer 88 greatly affects the efficiency of the power supply. The transformer 88 was interleaved in order to reduce leakage energy stored in the winding window. The winding build was implemented such that the LV winding was wound in two layers on either side of the HV winding. First, 8 turns of 150/44 litz-wire (150 strands of AWG 44 litz construction) was wound around a CPH-E25/10/6-1S-10P-Z bobbin. Next, 41 turns of 66/44 litz-wire (66 strands of AWG 44 litz construction) was wound, followed by 7 turns of 150/44 litz-wire. The insulation on the litz-wire bundle was deemed sufficient for voltage isolation (an anticipated maximum of 2× of peak input voltage of 170 V). In a design with no interleaving, the loss due to leakage energy of the transformer was expected to be 0.5 W (about 2% of total loss). By interleaving the transformer, the loss was reduced by 4× to 120 mW (about 0.4% of total loss). The transformer is expected to dissipate approximately 5% of the total loss.

Referring still to FIG. 7, as described above, the switch $Q_1$ is a MOSFET 90 in the circuit 80. Several commercially available MOSFETs were investigated. The losses were estimated for each part based on voltage and current stresses obtained from circuit simulations. The switching loss and conduction loss of several MOSFETs manufactured by Fairchild Semiconductor Inc. were investigated. Fairchild Semiconductor parts were investigated since they are already in use in other GE lighting products (e.g. PAR38 LED lamp). However, parts from other vendors may also be suitable.

The strategy of operating the flyback converter 80 in discontinuous conduction mode leads to high peak currents, particularly in the high frequency ripple. Hence minimizing the channel resistance is critical. Also, the switching loss can be high at 140 kHz. The trade-offs associated with both conduction loss and switching loss is shown in Table III, below:

TABLE III

MOSFET LOSS CALCULATIONS

| Model | $V_{rated}$ (V) | $I_{rated}$ (A) | $2xR_{dson}$ m$\Omega$ | Cross-eff (pF) | Ciss (pF) | Pds-coss (mW) | Pds-RdsLF (mW) | Pds-RdsHF (mW) | Pgs-ciss (mW) | Ptotal (W) | % Loss % | $/unit ($) |
|---|---|---|---|---|---|---|---|---|---|---|---|---|
| FCP16N60 | 600 | 16 | 0.44 | 110 | 1730 | 400 | 46.8 | 79.1 | 24.2 | 0.55 | 1.84% | 1.28 |
| FCP11N60 | 600 | 11 | 0.64 | 95 | 1148 | 350 | 68.0 | 115.1 | 16.1 | 0.55 | 1.82% | 1.00 |
| FCP4N60ND | 600 | 7 | 1.06 | 60 | 710 | 220 | 112.7 | 190.6 | 9.9 | 0.53 | 1.78% | 0.73 |
| FCP4N60ND | 600 | 4 | 2 | 32 | 415 | 120 | 212.6 | 359.6 | 5.8 | 0.70 | 2.32% | 0.54 |
| FQP8N60C | 600 | 7.5 | 2.4 | 105 | 965 | 380 | 255.1 | 431.5 | 13.5 | 1.08 | 3.62% | 0.42 |
| FQP6N60C | 600 | 5.5 | 4 | 65 | 620 | 240 | 425.1 | 719.1 | 8.7 | 1.39 | 4.64% | 0.38 |

Based on the above-mentioned analysis, the MOSFET FCP4N60ND exhibits the lowest estimated loss. However, the MOSFETs, FCP11N60 and FCP16N60 are also comparable in performance. The MOSFET, FCP11N60 was chosen based on availability. This design is expected to dissipate about 2% of total power in the converter.

Referring now to FIG. 8, an example of a suitable circuit 92 that was designed and tested for use as the synthetic jet power supply 26, of the disclosed lighting system 10 is provided. As previously described, an array of five synthetic jet devices (18) was included in the previously described embodiment. One exemplary circuit 92 of FIG. 8 was designed to include the following characteristics and parameters described in Table IV, below:

TABLE IV

PARAMETERS FOR POWER CIRCUIT FOR SYNTHETIC JET.

| Parameter | Value |
|---|---|
| Excitation frequency for jets | 175 Hz sinusoidal |
| DC Blocking capacitor ($C_1$) | 44 pF Tantalum capacitor |
| Resonant inductor (L) | 0.1 mH at 400 Hz, Silicon Steel core |
| ESR of L (R) | 6.5 $\Omega$ at DC |
| Tuning capacitor ($C_2$) | 0.33 uF Ceramic capacitor |
| ESR per SJ (Rsj) | 200 $\Omega$ |
| Capacitance of 5 synthetic jets in parallel (Csj) | ≈500 nF |

TABLE IV-continued

PARAMETERS FOR POWER CIRCUIT FOR SYNTHETIC JET.

| Parameter | Value |
|---|---|
| Expected power consumption by synthetic jet circuit | 0.5 W |

The circuit 92 provides a way to achieve the required drive conditions. The principle behind the circuit 92 is to drive a resonant circuit that is formed with the synthetic jet devices 18. The synthetic jet 18 is modeled by block 94, which includes a capacitor ($C_{SJ}$) with a series resistance ($R_{SJ}$) that represents the energy lost in physically actuating the synthetic jet 18. The resonant frequency is set to be the frequency at which the synthetic jet 18 operates. This is achieved by using an inductor (L) with a series resistance ($R_L$), and a capacitor ($C_2$). The capacitor, $C_1$, is a capacitor used to block the DC component. Any residual DC present at the output is attenuated by the resistor, $R_D$. By virtue of the Q of the resonant circuit, peak voltage of the square voltage produced by the driver is amplified to provide the required voltage at the output.

The circuit 92 includes a timer circuit 96 that can be assembled using a commercial chip to provide square voltage waveforms. A driver 98 is implemented to buffer the timer 96 from the load 94 in case the output current drawn is beyond the capability of the timer circuit 96. The component, L, can be wound with a magnetic core and wire.

A single modeled synthetic jet 94 was experimentally characterized by applying a sinusoidal voltage at the frequency of operation (175 Hz). The phase and magnitude of the impedance were calculated as the ratio of the measured voltage across and measured current through the modeled jet 94. The modeled jet 94 was driven with an amplifier for this experiment. This value is representative of the value $R_{SJ}$.

The expected performance of the prototype is shown in Table V.

TABLE V

LOSS ESTIMATES FOR LED POWER SUPPLY

| | |
|---|---|
| Estimated loss in transformer | 0.5-0.75 W |
| Estimated loss in MOSFET | 0.55 |
| Estimated loss in auxiliary circuits | 1.5 W |
| Estimated loss in synthetic jet circuit | 0.5 W |
| Percentage loss w.r.t. output power | ≈10% |

As will be appreciated, various circuits may be provided as part of the driver electronics 16, depending on the requirements. The circuits 80 and 92 provide one example of suitable circuits to achieve the aforementioned goals.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A lighting system, comprising:
    a housing structure;
    a light source configured to provide illumination visible through an opening in the housing structure;
    a thermal management system configured to provide a unidirectional air flow through the housing structure; and
    driver electronics configured to provide power to each of the light source and the thermal management system.

2. The lighting system, as set forth in claim 1, wherein the housing structure comprises:
    a cage having slots therein and configured to contain the driver electronics;
    a thermal management system housing configured to contain the thermal management system, and having a plurality of air ports, wherein at least one of the plurality of air ports is configured to entrain ambient air, and at least another of the plurality of air ports is configured to reject warmed air from the lighting system into the ambient air; and
    a face plate having the opening formed therethrough.

3. The lighting system, as set forth in claim 1, wherein the light source comprises at least one light emitting diode (LED).

4. The lighting system, as set forth in claim 1, wherein the light source comprises 19 blue light emitting diodes arranged in an array.

5. The lighting system, as set forth in claim 1, comprising:
    a heat sink;
    a plurality of synthetic jet devices; and
    a duct system comprising ducts configured to intake or outtake ambient air.

6. The lighting system, as set forth in claim 5, wherein the heat sink comprises a base portion coupled to the light source and a plurality of fins extending from the base portion, wherein the plurality of fins provide a plurality of air gaps there between.

7. The lighting system, as set forth in claim 6, wherein at least one of the plurality of fins has one of the plurality of synthetic jet devices coupled thereto.

8. The lighting system, as set forth in claim 7, wherein when the synthetic jet devices are activated, a unidirectional air flow path is provided along each of the plurality of air gaps, through the length of each of the plurality of fins.

9. The lighting system, as set forth in claim 1, wherein the driver electronics comprises a light emitting diode (LED) power supply and a synthetic jet power supply.

10. The lighting system, as set forth in claim 9, wherein each of the LED power supply and synthetic jet power supply is arranged on a single printed circuit board.

11. A lighting system, comprising:
    an array of light emitting diodes (LEDs) arranged on a surface of a lighting plate; and
    a thermal management system arranged above the array of LEDs, wherein the thermal management system comprises at least one synthetic jet device arranged in parallel with a heat sink, wherein each of the at least one synthetic jet devices is configured to produce a jet stream in a direction parallel to the surface of the lighting plate.

12. The lighting system, as set forth in claim 11, comprising driver electronics arranged above the thermal management system and configured to provide power to each of the thermal management system and the array of light emitting diodes.

13. The lighting system, as set forth in claim 12, wherein the driver electronics are contained on a single board.

14. The lighting system, as set forth in claim 11, wherein the array of light emitting diodes comprises less than or equal to 19 light emitting diodes.

15. The lighting system, as set forth in claim 11, wherein the lighting system comprises a screw-based structure configured to electrically couple the lighting system to a standard socket.

16. The lighting system, as set forth in claim 11, wherein the lighting system is configured to produce at least approximately 1500 lumens.

17. The lighting system, as set forth in claim 11, wherein the heat sink comprises a heat-conducting base portion coupled to the surface of the lighting plate, and a plurality of heat-conducting fins extend from the surface of the base portion.

18. The lighting system, as set forth in claim 17, wherein the at least one synthetic jet device comprises a plurality of synthetic jet devices, wherein each of the plurality of synthetic jet devices is coupled to a respective heat-conducting fin.

19. A lighting system, comprising:
   an Edison base configured to couple to electrically couple to a standard light socket;
   a light source; and
   a thermal management system, comprising:
      passive cooling components comprising a plurality of fins; and
      active cooling components, wherein the active cooling components are mounted on the plurality of fins.

20. The lighting system of claim 19 wherein the active cooling components are arranged in parallel with the plurality of fins.

21. The lighting system of claim 19 wherein each of the plurality of fins are parallel to one another and each pair of adjacent fins has a different one of the active cooling components mounted therebetween.

* * * * *